US012682959B2

(12) United States Patent
Weng et al.

(10) Patent No.: US 12,682,959 B2
(45) Date of Patent: Jul. 14, 2026

(54) POWER LOSS PROTECTION AND RESET SIGNAL GENERATION IN MEMORY SYSTEMS

(71) Applicant: Yangtze Memory Technologies Co., Ltd., Wuhan (CN)

(72) Inventors: Qinghuang Weng, Wuhan (CN); Hengwen Wu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 72 days.

(21) Appl. No.: 18/397,773

(22) Filed: Dec. 27, 2023

(65) Prior Publication Data

US 2025/0029662 A1 Jan. 23, 2025

Related U.S. Application Data

(63) Continuation of application No. PCT/CN2023/108056, filed on Jul. 19, 2023.

(51) Int. Cl.
| | |
|---|---|
| *G11C 16/22* | (2006.01) |
| *G11C 29/52* | (2006.01) |
| *G11C 16/04* | (2006.01) |

(52) U.S. Cl.
CPC ............ *G11C 16/225* (2013.01); *G11C 29/52* (2013.01); *G11C 16/0483* (2013.01)

(58) Field of Classification Search
CPC ........................................................ G06F 1/32
See application file for complete search history.

(56) References Cited

U.S. PATENT DOCUMENTS

| | | | |
|---|---|---|---|
| 4,422,163 A | 12/1983 | Oldenkamp | |
| 5,027,328 A | 6/1991 | Nakashima | |
| 5,379,415 A | 1/1995 | Papenberg et al. | |
| 10,180,695 B1 * | 1/2019 | Bikulcius | G05F 1/468 |
| 2005/0057955 A1 | 3/2005 | Oikawa | |

(Continued)

FOREIGN PATENT DOCUMENTS

| | | |
|---|---|---|
| CN | 202472631 U | 10/2012 |
| CN | 203338762 U | 12/2013 |

(Continued)

OTHER PUBLICATIONS

Office Action in Taiwanese Appln. No. 113126601, mailed on Mar. 11, 2025, 29 pages (with machine translation).

(Continued)

*Primary Examiner* — Douglas King
(74) *Attorney, Agent, or Firm* — Fish & Richardson P.C.

(57) ABSTRACT

The present disclosure relates to methods and apparatuses for power loss protection in a memory system. In one example, a memory system includes a memory device, a controller, a power loss protection (PLP) circuit, and a protection circuit. The controller is coupled to the memory device. A reset terminal of the controller is coupled to a capacitor. The protection circuit is coupled to the controller and the PLP circuit. The protection circuit is configured to: receive a PLP output voltage from the PLP circuit, receive a system supply voltage, and provide a reset signal to the reset terminal of the controller in response to determining that the PLP output voltage is lower than a fraction of the system supply voltage.

20 Claims, 5 Drawing Sheets

(56) References Cited

U.S. PATENT DOCUMENTS

| | | | | |
|---|---|---|---|---|
| 2006/0006740 | A1* | 1/2006 | Sugiyama | H02J 7/007182 |
| | | | | 307/66 |
| 2013/0148454 | A1 | 6/2013 | Behrends et al. | |
| 2014/0001861 | A1* | 1/2014 | Mann | H03K 17/62 |
| | | | | 307/64 |
| 2025/0105658 | A1* | 3/2025 | Sudo | G06F 1/14 |

FOREIGN PATENT DOCUMENTS

| | | | |
|---|---|---|---|
| CN | 216014818 | U | 3/2022 |
| EP | 4086907 | A1 | 11/2022 |
| JP | H04-178854 | A | 6/1992 |

OTHER PUBLICATIONS

International Search Report and Written Opinion in International Appln. No. PCT/CN2023/108056, mailed on Jan. 3, 2024, 9 pages.
Office Action in Korean Appln. No. 10-2024-7030144, mailed on May 20, 2025, 17 pages (with English translation).
Notice of Allowance in Japanese Appln. No. 2024-553238, mailed on Sep. 16, 2025, 5 pages (with English translation).
Office Action in Korean Appln. No. 10-2024-7030144, mailed on Jan. 13, 2026, 6 pages (with machine translation).
Communication pursuant to Article 94(3) EPC in European Appln. No. 23762144.6, mailed on Mar. 3, 2026, 8 pages.

* cited by examiner

202

206

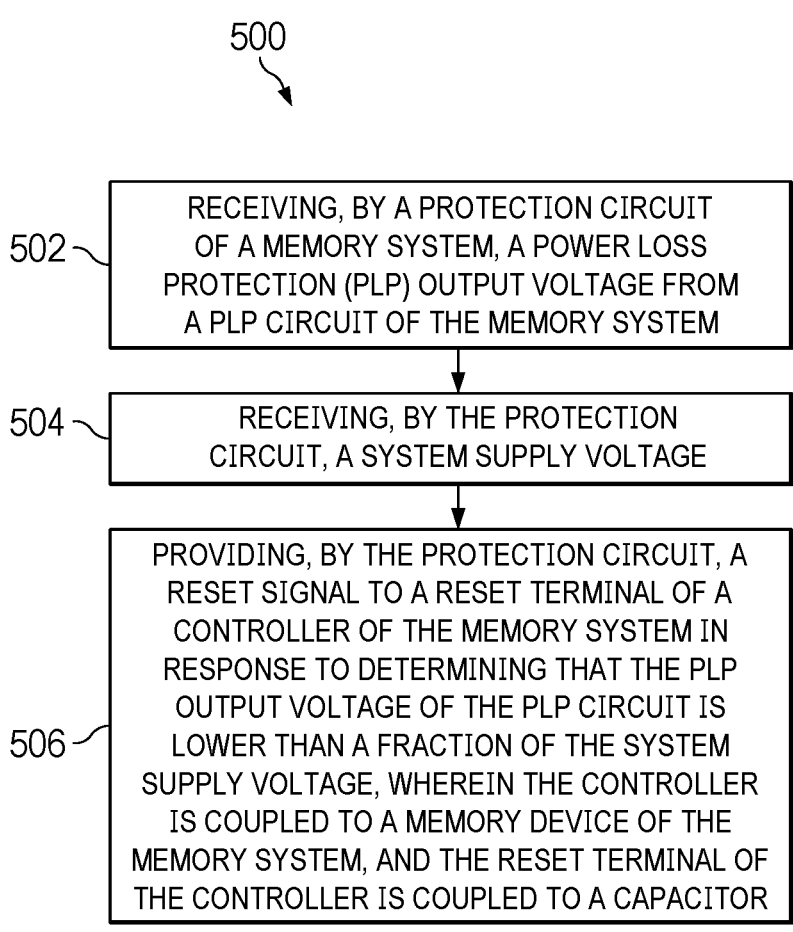

500

502 — RECEIVING, BY A PROTECTION CIRCUIT OF A MEMORY SYSTEM, A POWER LOSS PROTECTION (PLP) OUTPUT VOLTAGE FROM A PLP CIRCUIT OF THE MEMORY SYSTEM

504 — RECEIVING, BY THE PROTECTION CIRCUIT, A SYSTEM SUPPLY VOLTAGE

506 — PROVIDING, BY THE PROTECTION CIRCUIT, A RESET SIGNAL TO A RESET TERMINAL OF A CONTROLLER OF THE MEMORY SYSTEM IN RESPONSE TO DETERMINING THAT THE PLP OUTPUT VOLTAGE OF THE PLP CIRCUIT IS LOWER THAN A FRACTION OF THE SYSTEM SUPPLY VOLTAGE, WHEREIN THE CONTROLLER IS COUPLED TO A MEMORY DEVICE OF THE MEMORY SYSTEM, AND THE RESET TERMINAL OF THE CONTROLLER IS COUPLED TO A CAPACITOR

FIG. 5

POWER LOSS PROTECTION AND RESET SIGNAL GENERATION IN MEMORY SYSTEMS

CROSS-REFERENCE TO RELATED APPLICATIONS

This application is a continuation of International Application No. PCT/CN2023/108056, filed on Jul. 19, 2023, the disclosure of which is hereby incorporated by reference in its entirety.

TECHNICAL FIELD

The present disclosure generally relates to memory devices and memory systems, and in particular, to power loss protection and reset signal generation in memory systems.

BACKGROUND

Flash memory is a low-cost, high-density, nonvolatile solid-state storage medium that can be electrically erased and reprogrammed. Flash memory includes NOR flash memory and NAND flash memory. The growing demands of consumer electronics, cloud computing, and big data bring a constant need of flash memories of larger capacity and better performance. Today's flash memory devices, such as a solid state drive (SSD) and an enhanced SSD, have been designed with stringent performance and reliability requirements. Power failure can potentially damage a memory device and corrupt data stored in the memory device, affecting its performance and reliability. Thus, most memory devices require power loss protection (PLP) mechanisms.

SUMMARY

The present disclosure relates to methods and apparatuses for power loss protection (PLP) in a memory system. In one example, a memory system includes a memory device, a controller, a power management integrated circuit (PMIC), and a protection circuit. The controller is coupled to the memory device. A reset terminal of the controller is coupled to a capacitor. The protection circuit is coupled to the controller and the PMIC. The protection circuit is configured to: receive a PLP output voltage from the PMIC, receive a system supply voltage, and provide a reset signal to the reset terminal of the controller in response to determining that the PLP output voltage is lower than a fraction of the system supply voltage.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 5 illustrates a flowchart of an example method for resetting a memory system, in accordance with some aspects of the present disclosure.

Like reference numbers and designations in the various drawings indicate like elements.

DETAILED DESCRIPTION

Figure 1:
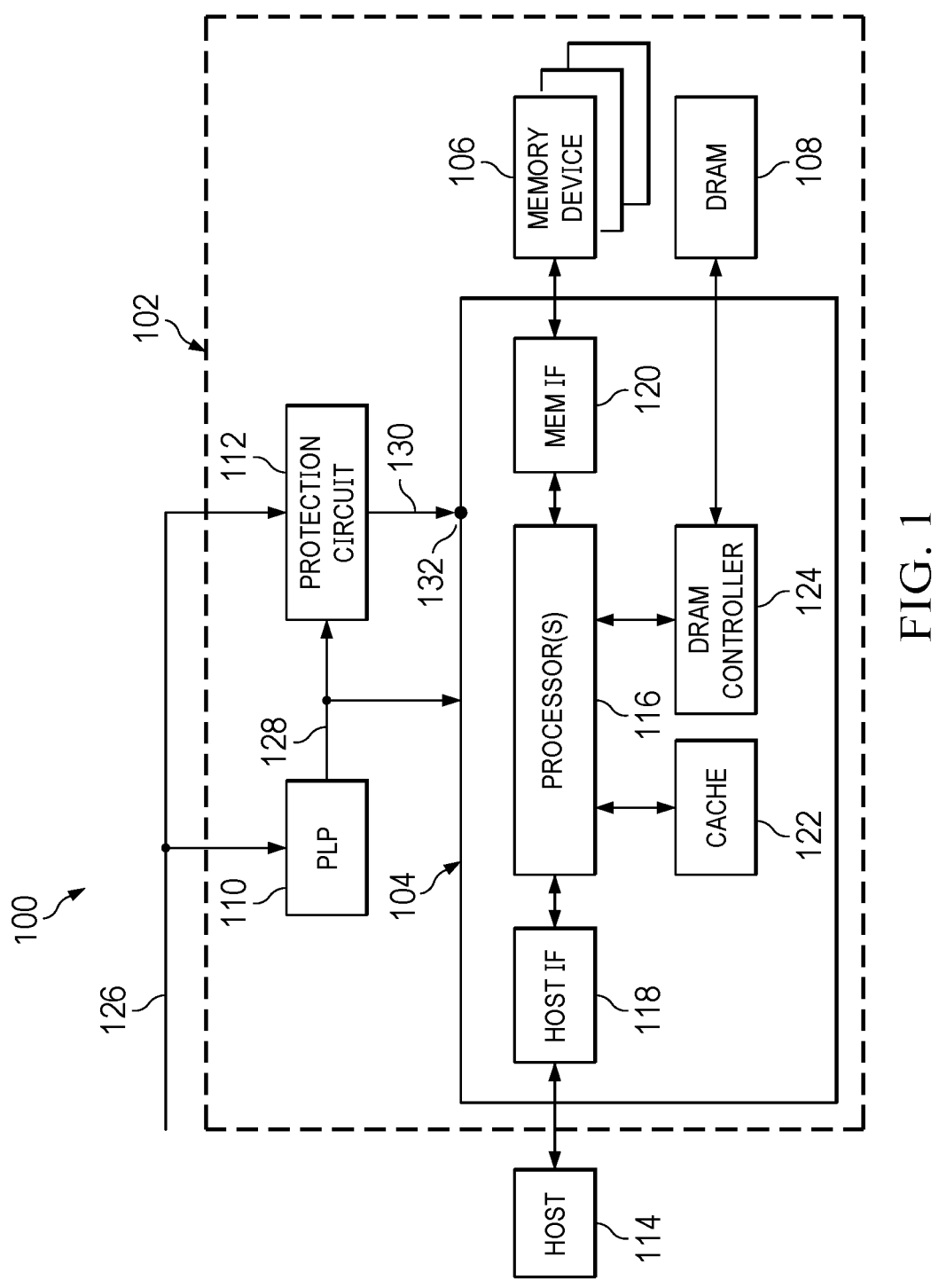
FIG. 1 illustrates an example of a block diagram of a system having a memory system, according to some aspects of the present disclosure.

Power failures, which are usually caused by battery malfunction, supply power outage, or accidentally unplugging a device from a computer, may damage a memory device and corrupt data stored in the memory device unless there is an effective power loss protection (PLP) mechanism. A nonvolatile memory device, such as a solid state drive (SSD), may use a temporary buffer (for example, a volatile memory) when writing data into a nonvolatile storage media. An unexpected power loss during accessing the temporary buffer may cause data corruption or data loss, even rendering the memory device unusable. Thus, SSDs can be vulnerable to unexpected power failures.

During a normal power off procedure, a host of an SSD can notify the SSD that the power is about to be shut down so that the SSD has enough time to prepare for the power off. The preparation may include a series of operations performed by both a controller of the SSD and a NAND memory of the SSD. For instance, the controller may flush data from a volatile memory, such as a dynamic random-access memory (DRAM), to the NAND memory. The controller may also update mapping tables that record the mapping relationships between logical addresses and physical addresses. In addition, the SSD may store its current status into some flag registers. After these operations, the SSD can send a signal to the host indicating that it is ready for the power off. Upon receiving the indication signal from the SSD, the host may shut down the power supply.

In the event of an unexpected power failure, the SSD may rely on a PLP mechanism to provide holdup power, which allows the controller and the NAND memory of the SSD to perform the abovementioned operations to save the data and working status safely. A typical PLP mechanism uses an extra energy storage device such as a battery or a capacitor to provide power to the SSD for a sufficient time period in case the SSD's power supply is suddenly removed.

When the SSD is powered back on, the controller may receive a reset signal on a reset terminal of the controller from a power management integrated circuit (PMIC). In some implementations, the reset signal is a voltage signal and triggers the controller to start working when voltage is high. That is, the controller stops working when the voltage level at the reset terminal is below a reset threshold and starts to work when the voltage level at the reset terminal is above the reset threshold. The SSD may need to precisely coordinate a timing of starting the controller with some other devices of the SSD, because the proper functioning of the controller may require the other devices to be ready. For example, the other devices may need to finish their preparation operations or receiving their power supply before the controller starts.

To this end, the controller's reset terminal may be coupled to the ground through a capacitor. The capacitor helps generate a power up delay for the controller, which is explained in the following. During a normal power up procedure, before receiving the reset signal, the reset terminal is kept at a low voltage level, which is approximately 0 volt (V). When the reset terminal receives the reset signal at a high voltage level, the reset signal charges the capacitor so that the voltage level at the reset terminal will increase from a low level to a high level. The time it takes for the voltage level at the reset terminal to raise from the low level to the reset threshold that triggers the starting of the controller can be referred to as a power up delay. The power up delay should be long enough to meet the coordination requirement described above (so that the other devices of the SSD can prepare and get ready before the controller starts).

However, the power up delay may not meet the coordination requirement during an unexpected power failure, which can lead to malfunction of the controller of the SSD. When the supply power is removed or unstable, the PMIC may still provide the reset signal to the reset terminal of the controller due to the holdup power generated by the PLP mechanism. As such, the capacitor coupled to the reset terminal may still hold a voltage, which can be significantly higher than 0V. When the supply power is back on and return to a stable level, the reset signal charges the capacitor from that voltage. Compared with the normal power up procedure, where the reset signal charges the capacitor from approximately 0V, the power up delay during a reset procedure caused by the power failure is shortened, and thus may not be sufficient to coordinate the starting of the controller and the other devices of the SSD.

The present disclosure provides techniques for a memory system to use a protection circuit to generate a proper power up delay for a controller of the memory system. The protection circuit is configured to receive a PLP output voltage from a PMIC and a system supply voltage. The protection circuit may compare the PLP output voltage to the system supply voltage and provide a reset signal to the controller upon determining that the PLP output voltage is lower than a fraction of the system supply voltage. The above aspects and some other aspects of the present disclosure are discussed in greater detail below.

FIG. 1 illustrates an example of a block diagram of system 100 having a memory system 102, according to some aspects of the present disclosure. As shown in FIG. 1, system 100 can include a host 114 and a memory system 102 having one or more memory devices 106 and a controller 104. Memory system 102 further includes a DRAM 108, a PMIC 110, and a protection circuit 112. In some implementations, memory system 102 is an SSD. Host 114 can be a processor of an electronic device, such as a central processing unit (CPU), or a system-on-chip (SoC), such as an application processor (AP). Host 114 can be configured to send or receive data to or from memory devices 106.

Controller 104 is coupled to memory device 106 and host 114 and is configured to control memory device 106, according to some implementations. Controller 104 can manage the data stored in memory device 106 and communicate with host 114. In some implementations, controller 104 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, controller 104 is designed for operating in a high duty-cycle environment solid state drives (SSDs) or embedded multimedia-cards (eMMCs) used as data storage for mobile devices, such as smartphones, tablets, laptop computers, etc., and enterprise storage arrays. Controller 104 can be configured to control operations of memory device 106, such as read, erase, and program operations. Controller 104 can also be configured to manage various functions with respect to the data stored or to be stored in memory device 106 including, but not limited to bad-block management, garbage collection, logical-to-physical address conversion, wear leveling, etc. In some implementations, controller 104 is further configured to process error correction codes (ECCs) with respect to the data read from or written to memory device 106. Any other suitable functions may be performed by controller 104 as well, for example, formatting memory device 106. Memory device 106 can be a NAND flash memory or any memory device disclosed in the present disclosure.

In some implementations, the memory system 102 does not include controller 104, and host 114 is coupled to memory device 106 directly. The controller 104 may be located in the host 114. Alternatively, the host 114 may not include the 104 but may be configured to perform functions similar to what controller 104 does as described above.

Controller 104 includes one or more processors 116, a host interface 118, a memory interface 120, a cache 122, and a DRAM controller 124. Controller 104 can communicate with an external device (e.g., host 114) according to a particular communication protocol. As shown in FIG. 1, Processor 116 is coupled to host 114 through host interface 118. Host interface 118 allows controller 104 to communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Processor 116 may be coupled to memory device 106 through memory interface 120 and configured to control memory device 106. Processor 116 may be coupled to a cache 122 and a DRAM controller 124. Cache 122 may be configured to store temporary information. DRAM controller 124 may be configured to access information store on DRAM 108.

PMIC 110 includes a PLP circuit configured to provide the PLP mechanism. The PLP circuit may be configured to provide a stable output voltage when a system supply voltage is lost. In some implementations, PMIC 110 is a PLP circuit integrated with some other power management related circuits. In some implementations, PMIC 110 is a single PLP circuit configured to provide PLP related functions, and other power management functions are provided by another separate power management circuit. Both PMIC 110 (also referred to as PLP circuit 110) and protection circuit 112 receives a system supply voltage 126. PMIC 110 is configured to generate a PLP output voltage 128 to controller 104 and protection circuit 112. Protection circuit is configured to provide a reset signal 130 to a reset terminal 132 of controller 104.

Figure 2A:
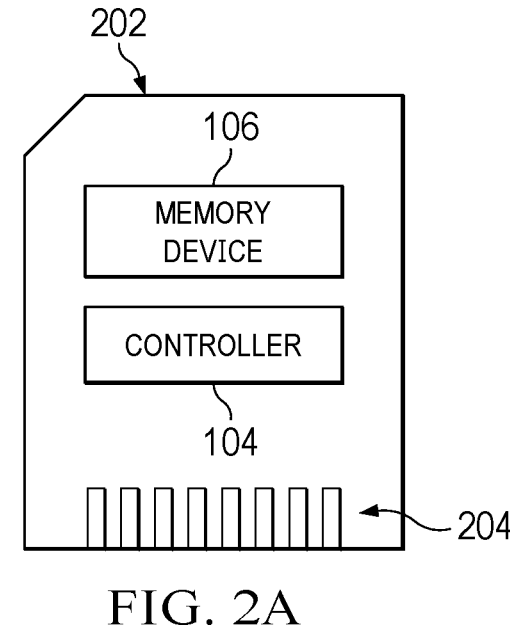
FIGS. 2A and 2B illustrate example storage devices, according to some aspects of the present disclosure.
Figure 2B:
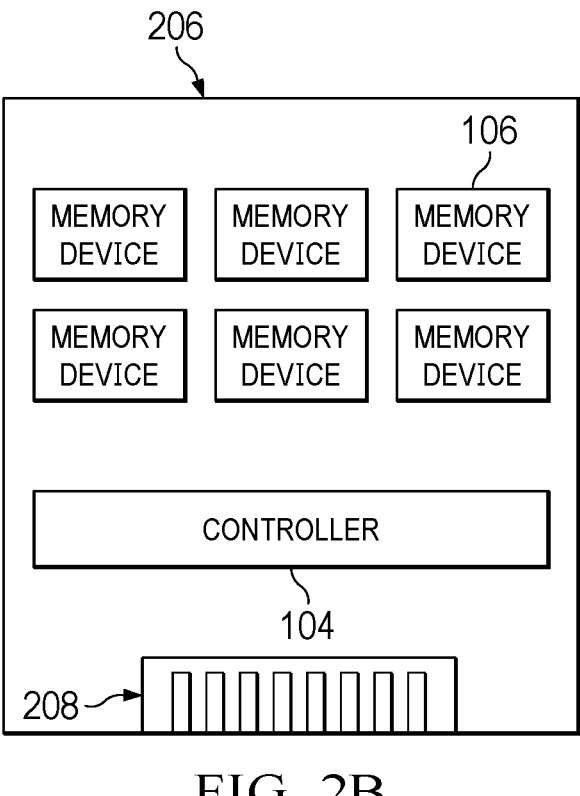

Controller 104 and one or more memory devices 106 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, controller 104 and a single memory device 106 may be integrated into a memory card 202. Memory card 202 can include a PC card (PCM-CIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 114 in FIG. 1). In another example as shown in FIG. 2B, controller 104 and multiple memory devices 106 may be integrated into an SSD 206. SSD 206 can further include an SSD connector 208 coupling SSD 206 with a host (e.g., host 114 in FIG. 1). In some implementations, the storage capacity and/or the operation speed of SSD 206 is greater than those of memory card 202.

Figure 3:
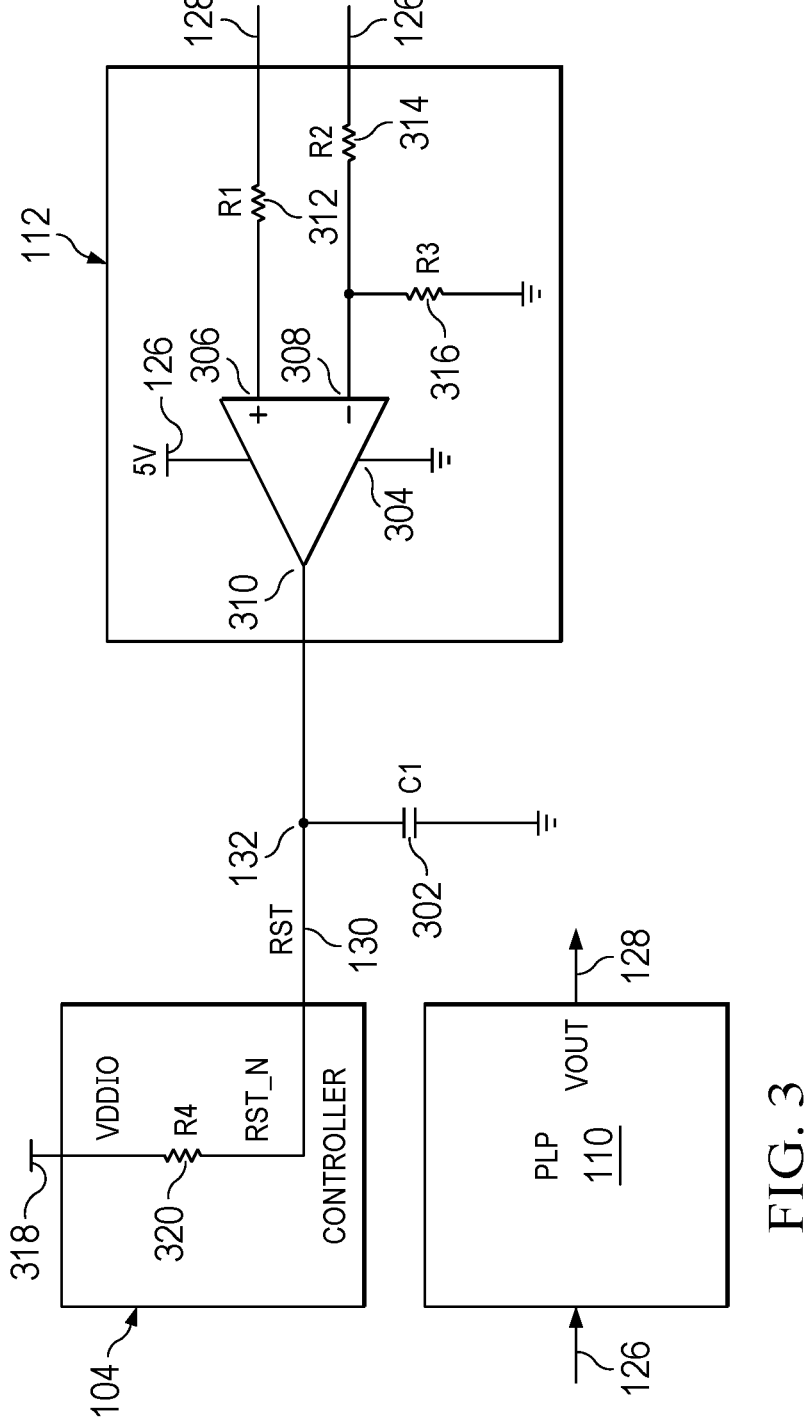
FIG. 3 illustrates a block diagram of an example protection circuit, according to some aspects of the present disclosure.

FIG. 3 illustrates a block diagram of an example protection circuit 112, according to some aspects of the present disclosure. The protection circuit 112 includes a comparator 304 having inputs 306 and 308 and an output 310. One of input 306 and input 308 is coupled to PLP output voltage 128 from PMIC 110, another is coupled to system supply voltage 126. In some implementations, input 306 is a non-inverting input, and input 308 is an inverting input. As shown in FIG. 3, comparator 304 may also be powered by system supply voltage 126. Output 310 of comparator 304 is coupled to reset terminal 132 of controller 104. As explained above, capacitor 302 is coupled between reset terminal 132 and the ground and is configured to help generate a power up delay for controller 104.

In some implementations, input 306 may be coupled to PLP output voltage 128 through a current-limiting resistor 312. Input 308 may be coupled to system supply voltage 126 through a voltage divider. That is, the voltage divider divides system supply voltage 126 and outputs the fraction of the system supply voltage 126 to input 308. The voltage divider may include two or more resistors. For example, as shown in FIG. 3, the voltage divider includes resistor 314 and resistor 316. Resistor 314 is coupled between input 308 and system supply voltage 126, and resistor 316 is coupled between input 308 and the ground.

Protection circuit 112 is configured to compare PLP output voltage 128 with system supply voltage 126 and provide reset signal 130 in response to determining that PLP output voltage 128 is lower than a fraction of system supply voltage 126. The fraction of system supply voltage 126 is determined based on the voltage divider. In the example of FIG. 3, the fraction is about a resistance of resistor 316 divided by a sum of a resistance of resistor 314 and the resistance of resistor 316.

In some implementations, the voltage divider is configured to generate the fraction of system supply voltage 126 so that the fraction of system supply voltage 126 is lower than PLP output voltage 128 when system supply voltage 126 is within a proper working range.

In some implementations, comparator 304 is an open drain comparator. That is, output 310 of comparator 304 is further coupled to the ground in response to determining that PLP output voltage 128 is lower than the fraction of system supply voltage 126.

In some implementations, upon determining that PLP output voltage 128 is lower than the fraction of system supply voltage 126, protection circuit 112 is configured to hold the reset signal below a reset threshold voltage level for a time period. The time period may be referred to as the power up delay for controller 104 and may be increased or decreased by adjusting at least one of the two or more resistors of the voltage divider.

Controller 104 may receive voltage input 318. Voltage input 318 is coupled to reset terminal 132 through a resistor 320 located within controller 104. In some implementations, the resistor 320 is a pull-up resistor. In response to determining that PLP output voltage 128 is higher than the fraction of system supply voltage 126, protection circuit 112 is configured to output a sufficiently high resistance such that the voltage at the reset terminal 132 is close to the voltage input 318. The voltage at the reset terminal 132 is slightly lower than the voltage input 318, and a voltage drop between the voltage input 318 and the voltage at the reset terminal 132 is determined by a resistance of resistor 320 and a current flowing through resistor 320. The voltage input 318 is configured to pull the voltage at the reset terminal 132 to a higher level (which is higher than the reset threshold of controller 104) so that controller 104 keeps working.

In some implementations, comparator 304 may be a comparator of any suitable type, such as an operational amplifier (op-amp) comparator or a push-pull comparator. Any suitable modification to the described protection circuit apparent to a person of ordinary skill in the art may be applied.

In some implementations, capacitor 302 may be located either inside or outside protection circuit 112.

In some implementations, protection circuit 112 may be integrated into PMIC 110.

Figure 4:
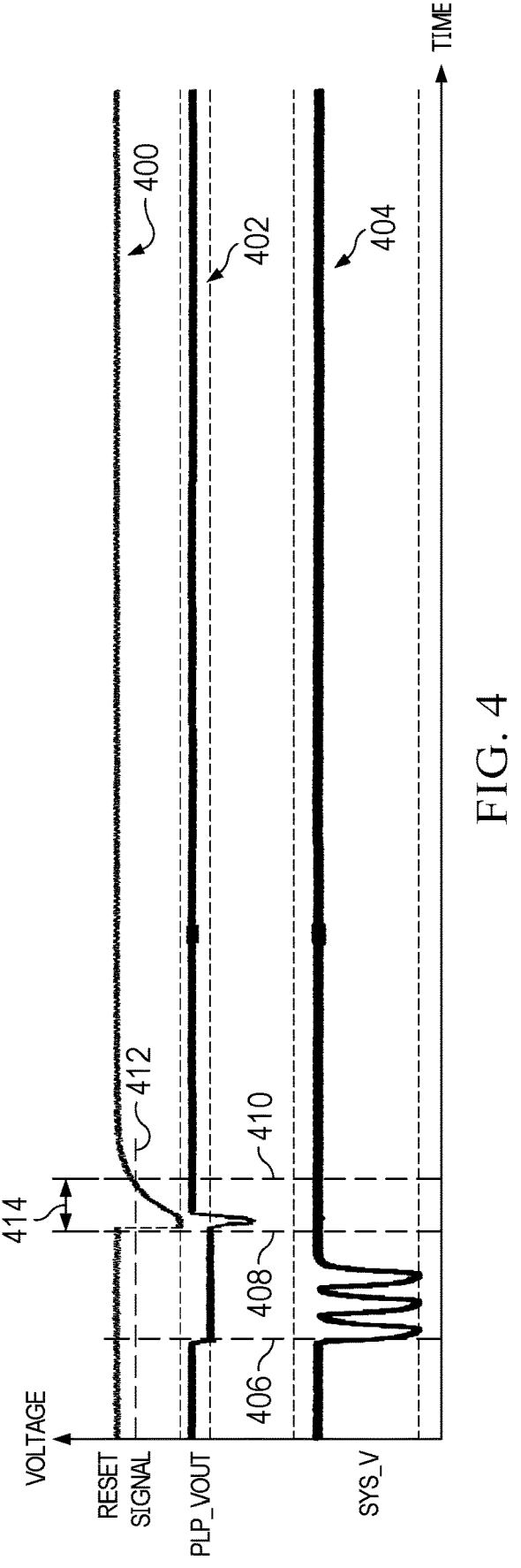
FIG. 4 illustrates example waveforms of a system supply voltage, a power loss protection (PLP) output voltage, and a reset signal generated by the protection circuit of FIG. 3, according to some aspects of the present disclosure.

FIG. 4 illustrates example waveforms of system supply voltage 126, PLP output voltage 128, and reset signal 130 generated by protection circuit 112 of FIG. 3, according to some aspects of the present disclosure. Waveform 400 is a waveform of reset signal 130 before, during, and after a power failure. Waveforms 402 and 404 are waveforms of PLP output voltage 128 and system supply voltage 126 respectively under the same scenario. As shown in FIG. 4, the power failure occurs at time 406. Before time 406, system supply voltage is close to 5V under a normal working condition. At time 406, power outage occurs, and thus the system supply voltage drops to a value close to 0V. In some implementations, the system supply voltage may even oscillate as shown in waveform 404 of FIG. 4. PLP output voltage is close to system supply voltage prior to the power failure. When the system supply voltage is lost, PMIC triggers the PLP mechanism and keeps providing PLP output voltage at a level close to 5V. The PLP output voltage may drop a little bit but still maintains at a relatively higher level (for example, 4.26V). As described above, the PLP output voltage at 4.26V is the holdup power. In some implementations, the holdup power during the power failure is generated by an internal Buck circuit and an energy storage capacitor of the PMIC.

In this example, the resistance of resistor 314 is 10 k ohm ($\Omega$), and the resistance of resistor 316 is 40.2 k$\Omega$. Thus, the divided system supply voltage applied at input 308 is close to 4V when the system supply voltage is about 5V.

After a while and before time 408, the system supply voltage resumes back to normal (around 5V). At time 408, the energy storage capacitor of the PMIC is depleted, and thus the PLP output voltage starts to drop.

Between time 406 and time 408, the system supply voltage is not stable due to the power loss, and thus the fraction of the system supply voltage also varies (between 0V and 4V). During this period, the PLP output voltage applied to input 306 (4.26V) is always higher than the maximum value of the fraction of system supply voltage applied to input 308 (4V). Thus, output 310 can be treated as a sufficiently large resistance connecting reset terminal 132 to the ground. As a result, the voltage at the reset terminal 132 is pulled up to the voltage input 318 of FIG. 3. For example, the voltage input 318 is 3.3V, the resistance of pull up resistor 320 is 58 kΩ, and the voltage at the reset terminal is about 3.1V, which is higher than a reset threshold 412 of the controller (for example, 3V). Therefore, even though the system supply voltage is unstable in between time 406 and time 408, the holdup power provided by the PLP mechanism of the PMIC and the reset signal provided by the protection circuit allow the controller and the memory devices to working properly and perform necessary operations to save the data and working status safely.

After time 408, the PLP output voltage applied to input 306 quickly drops to around 0V, which is lower than the fraction of system supply voltage applied at input 308 (4V). Thus, output 310 generated by protection circuit 112 pulls the voltage at the reset terminal 132 to the ground (approximately 0V). Controller 104 stops working because the voltage at the reset terminal 132 is lower than reset threshold 412 (for example, 3V) of controller 104. The energy stored in capacitor 302 is also released.

After PLP output voltage 128 drops to 0V, the PMIC may detect that system supply voltage 126 has resumed to a normal level (around 5V), and thus may connect PLP output voltage 128 to system supply voltage 126. PLP output voltage 128 applied to input 306 also quickly resumes to around 5V and is higher than the fraction of system supply voltage applied at input 308 (4V). Thus, output 310 can be treated as a sufficiently large resistance connecting reset terminal 132 to the ground. In this case, capacitor 302 starts to be charged by voltage input 318, and the voltage at reset terminal 132 raises from around 0V to around 3.1V (pulled up by voltage input 318). When the voltage at reset terminal 132 raises up to the reset threshold 412 (3V) at time 410, controller 104 starts to operate. A time period 414 between time 408 and time 410 is the power up delay for the controller 104. In this example, time period 414 is about 50 ms, which is long enough to coordinate the starting of controller 104 and the other devices of the memory system.

Without protection circuit 112, reset signal 130 either may not decrease to a level below reset threshold 412 or may drop to a level significantly higher than 0V, which will result in a much shorter power up delay (compared to time period 414), causing malfunction of controller 104.

FIG. 5 is a flowchart of an example method 500 for resetting a memory system, in accordance with some aspects of the present disclosure. The method 500 may be performed by any suitable device disclosed herein, such as the memory system 102, the controller 104, the memory device 106, the PMIC 110, and the protection circuit 112 in FIG. 1, and any combination thereof. The operations shown in method 500 may not be exhaustive and that other operations can be performed as well before, after, or between any of the illustrated operations. Further, some of the operations may be performed simultaneously, or in a different order than shown in FIG. 5.

At 502, a protection circuit (e.g., protection circuit 112) of the memory system (e.g., memory system 102) receives a PLP output voltage from a PMIC (e.g., PMIC 110) of the memory system. For example, the PLP output voltage may vary between 4.26V and 5V.

At 504, the protection circuit receives a system supply voltage. An example of the system supply voltage is 5V.

At 506, the protection circuit provides a reset signal to a reset terminal of a controller (e.g., controller 104) of the memory system in response to determining that the PLP output voltage of the PMIC is lower than a fraction of the system supply voltage, wherein the controller is coupled to the memory device, and the reset terminal of the controller is coupled to a capacitor.

In some implementations, the capacitor is coupled between the reset terminal of the controller and the ground. An example capacitance of the capacitor is 680 nF.

In some implementations, the protection circuit comprises a comparator, a first input of the comparator is coupled to the PLP output voltage, a second input of the comparator is coupled to the fraction of the system supply voltage, and an output of the comparator is coupled to the reset terminal of the controller.

In some implementations, the comparator is an open drain comparator, and the output of the comparator is further coupled to the ground in response to determining that the PLP output voltage is lower than the fraction of the system supply voltage.

In some implementations, the first input of the comparator is coupled to the PLP output voltage through a current-limiting resistor. An example resistance of the current-limiting resistor is 10 kΩ.

In some implementations, the second input of the comparator is coupled to the system supply voltage through a voltage divider comprising two or more resistors, and the voltage divider is configured to generate the fraction of the system supply voltage that is lower than the PLP output voltage in response to at least that the system supply voltage is within a proper working range. For example, one resistor in the voltage divider may have a resistance of 10 kΩ, and another resistor may have a resistance of 40.2 kΩ.

In some implementations, the protection circuit is configured to hold the reset signal below a reset threshold voltage level for a time period, and the time period is increased or decreased by adjusting at least one of the two or more resistors of the voltage divider. An example of the reset threshold voltage is 3V.

In some implementations, the controller performs one or more initialization operations for the memory device upon receiving the reset signal.

In some implementations, the controller receives the system supply voltage as a power supply.

In some implementations, the controller receives a second voltage input. The second voltage input is coupled to the reset terminal through a pull-up resistor located within the controller. The second voltage input and the pull-up resistor are configured to pull the voltage at the reset terminal above the reset threshold voltage. An example of the second voltage input is 3.3V. An example of the pull-up resistor is 58 kΩ.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multi-tasking or parallel processing (or a combination of multi-tasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

According to one aspect of the present disclosure, a memory system is disclosed. The memory system comprises a memory device, a controller coupled to the memory device, wherein a reset terminal of the controller is coupled to a capacitor, a PMIC, and a protection circuit coupled to the controller and the PMIC. The protection circuit is configured to: receive a PLP output voltage from the PMIC, receive a system supply voltage, and provide a reset signal to the reset terminal of the controller in response to determining that the PLP output voltage is lower than a fraction of the system supply voltage.

In some implementations, the capacitor is coupled between the reset terminal of the controller and the ground.

In some implementations, the protection circuit comprises a comparator, a first input of the comparator is coupled to the PLP output voltage, a second input of the comparator is coupled to the fraction of the system supply voltage, and an output of the comparator is coupled to the reset terminal of the controller.

In some implementations, the comparator is an open drain comparator, and the output of the comparator is further coupled to the ground in response to determining that the PLP output voltage is lower than the fraction of the system supply voltage.

In some implementations, the first input of the comparator is coupled to the PLP output voltage through a current-limiting resistor.

In some implementations, the second input of the comparator is coupled to the system supply voltage through a voltage divider comprising two or more resistors, and the voltage divider is configured to generate the fraction of the system supply voltage that is lower than the PLP output voltage in response to at least that the system supply voltage is within a proper working range.

In some implementations, the protection circuit is configured to hold the reset signal below a reset threshold voltage level for a time period, and the time period is increased or decreased by adjusting at least one of the two or more resistors of the voltage divider.

In some implementations, the controller performs one or more initialization operations for the memory device upon receiving the reset signal.

In some implementations, the controller receives the system supply voltage as a power supply.

In some implementations, the controller receives a second voltage input. The second voltage input is coupled to the reset terminal through a pull-up resistor located within controller. The second voltage input and the pull-up resistor are configured to pull the voltage at the reset terminal above the reset threshold voltage.

According to another aspect of the present disclosure, a power protection apparatus is disclosed. The power protection apparatus includes a controller, wherein a reset terminal of the controller is coupled to a capacitor, a PMIC, and a protection circuit coupled to the controller and the PMIC. The protection circuit comprises a comparator and is configured to receive a PLP output voltage of the PMIC, receive a system supply voltage, and provide a reset signal to the reset terminal of the controller in response to determining that the PLP output voltage of the PMIC is lower than a fraction of the system supply voltage. A first input of the comparator is coupled to the PLP output voltage. A second input of the comparator is coupled to the fraction of the system supply voltage. An output of the comparator is coupled to the reset terminal of the controller.

In some implementations, the capacitor is coupled between the reset terminal of the controller and the ground.

In some implementations, the comparator is an open drain comparator, and the output of the comparator is further coupled to the ground in response to determining that the PLP output voltage is lower than the fraction of the system supply voltage.

In some implementations, the first input of the comparator is coupled to the PLP output voltage through a current-limiting resistor.

In some implementations, the second input of the comparator is coupled to the system supply voltage through a voltage divider comprising two or more resistors, and the voltage divider is configured to generate the fraction of the system supply voltage that is lower than the PLP output voltage in response to at least that the system supply voltage is within a proper working range.

In some implementations, the protection circuit is configured to hold the reset signal for a time period, and the time period is increased or decreased by adjusting at least one of the two or more resistors of the voltage divider.

In some implementations, the controller performs one or more initialization operations for a memory device coupled to the controller upon receiving the reset signal.

In some implementations, the controller receives the system supply voltage as a power supply.

In some implementations, the controller receives a second voltage input. The second voltage input is coupled to the reset terminal through a pull-up resistor located within controller. The second voltage input and the pull-up resistor are configured to pull the voltage at the reset terminal above the reset threshold voltage.

According to another aspect of the present disclosure, a method for resetting a memory system is disclosed. The memory system includes a memory device, a controller, a PMIC, and a protection circuit. The method includes: receiving, by the protection circuit, a PLP output voltage from the PMIC; receiving, by the protection circuit, a system supply voltage; and providing, by the protection circuit, a reset signal to a reset terminal of the controller in response to determining that the PLP output voltage of the PMIC is lower than a fraction of the system supply voltage, wherein the controller is coupled to the memory device, and the reset terminal of the controller is coupled to a capacitor.

In some implementations, the capacitor is coupled between the reset terminal of the controller and the ground.

In some implementations, the protection circuit comprises a comparator, a first input of the comparator is coupled to the PLP output voltage, a second input of the comparator is coupled to the fraction of the system supply voltage, and an output of the comparator is coupled to the reset terminal of the controller.

In some implementations, the comparator is an open drain comparator, and the output of the comparator is further coupled to the ground in response to determining that the PLP output voltage is lower than the fraction of the system supply voltage.

In some implementations, the first input of the comparator is coupled to the PLP output voltage through a current-limiting resistor.

In some implementations, the second input of the comparator is coupled to the system supply voltage through a voltage divider comprising two or more resistors, and the voltage divider is configured to generate the fraction of the system supply voltage that is lower than the PLP output voltage in response to at least that the system supply voltage is within a proper working range.

In some implementations, the protection circuit is configured to hold the reset signal below a reset threshold voltage level for a time period, and the time period is increased or decreased by adjusting at least one of the two or more resistors of the voltage divider.

In some implementations, the controller performs one or more initialization operations for the memory device upon receiving the reset signal.

In some implementations, the controller receives the system supply voltage as a power supply.

In some implementations, the controller receives a second voltage input. The second voltage input is coupled to the reset terminal through a pull-up resistor located within the controller. The second voltage input and the pull-up resistor are configured to pull the voltage at the reset terminal above the reset threshold voltage.

According to another aspect of the present disclosure, a non-transitory computer-readable storage medium is disclosed. The non-transitory computer-readable storage medium includes programmable instructions for execution by at least one processor of a memory system to cause the memory system to perform operations including receiving commands from a host coupled to the memory system, wherein the memory system includes a memory device, the memory device includes a memory cell array, and the memory cell array includes a number of memory cells. The operations further include performing memory operations on the memory device based on the commands. The operations further include scanning at least a first group of memory cells of the memory cell array by performing a number of scans within a first scan period among the memory operations.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described example implementations, but should be defined only in accordance with the following claims and their equivalents. Accordingly, other implementations also are within the scope of the claims.

What is claimed is:

1. A memory system comprising:
a memory device;
a controller coupled to the memory device, wherein a reset terminal of the controller is coupled to a capacitor;
a power loss protection (PLP) circuit configured to provide PLP output voltage with a stable voltage level during a power failure; and
a protection circuit coupled to the controller and the PLP circuit, wherein the protection circuit is configured to:
receive the PLP output voltage from the PLP circuit;
receive a system supply voltage; and
provide a reset signal to the reset terminal of the controller in response to determining that the PLP output voltage is lower than a fraction of the system supply voltage, wherein the protection circuit is configured to pull the reset terminal to ground, by coupling an output of the protection circuit to ground when the PLP output voltage is lower than the fraction of the system supply voltage, to release energy stored in the capacitor due to the power failure.

2. The memory system according to claim 1, wherein the capacitor is coupled between the reset terminal of controller and the ground.

3. The memory system according to claim 1, wherein the protection circuit comprises a comparator, a first input of the comparator is coupled to the PLP output voltage, a second input of the comparator is coupled to the fraction of the system supply voltage, and an output of the comparator is coupled to the reset terminal of the controller.

4. The memory system according to claim 3, wherein the comparator is an open drain comparator.

5. The memory system according to claim 3, wherein the first input of the comparator is coupled to the PLP output voltage through a current-limiting resistor.

6. The memory system according to claim 3, wherein the second input of the comparator is coupled to the system supply voltage through a voltage divider comprising two or more resistors, and the voltage divider is configured to generate the fraction of the system supply voltage that is lower than the PLP output voltage in response to at least that the system supply voltage is within a proper working range.

7. The memory system according to claim 6, wherein the protection circuit is configured to hold the reset signal below a reset threshold voltage level for a time period, and the time period is increased or decreased by adjusting at least one of the two or more resistors of the voltage divider.

8. The memory system according to claim 1, wherein the controller performs one or more initialization operations for the memory device upon receiving the reset signal.

9. A power protection apparatus comprising:
  a controller, wherein a reset terminal of the controller is coupled to a capacitor;
  a power loss protection (PLP) circuit configured to provide PLP output voltage with a stable voltage level during a power failure; and
  a protection circuit coupled to the controller and the PLP circuit, wherein:
  the protection circuit comprises a comparator and is configured to:
    receive the PLP output voltage of the PLP circuit;
    receive a system supply voltage; and
    provide a reset signal to the reset terminal of the controller in response to determining that the PLP output voltage of the PLP circuit is lower than a fraction of the system supply voltage, wherein the protection circuit is configured to pull the reset terminal to ground, by coupling an output of the protection circuit to ground when the PLP output voltage is lower than the fraction of the system supply voltage, to release energy stored in the capacitor due to a power failure;
  a first input of the comparator is coupled to the PLP output voltage;
  a second input of the comparator is coupled to the fraction of the system supply voltage; and
  an output of the comparator is coupled to the reset terminal of the controller.

10. The power protection apparatus according to claim 9, wherein the capacitor is coupled between the reset terminal of the controller and the ground.

11. The power protection apparatus according to claim 10, wherein the comparator is an open drain comparator.

12. The power protection apparatus according to claim 10, wherein the first input of the comparator is coupled to the PLP output voltage through a current-limiting resistor.

13. The power protection apparatus according to claim 10, wherein the second input of the comparator is coupled to the system supply voltage through a voltage divider comprising two or more resistors, and the voltage divider is configured to generate the fraction of the system supply voltage that is lower than the PLP output voltage in response to at least that the system supply voltage is within a proper working range.

14. The power protection apparatus according to claim 13, wherein the protection circuit is configured to hold the reset signal for a time period, and the time period is increased or decreased by adjusting at least one of the two or more resistors of the voltage divider.

15. The power protection apparatus according to claim 9, wherein the controller performs one or more initialization operations for a memory device coupled to the controller upon receiving the reset signal.

16. A method for resetting a memory system comprising a memory device, a controller, a power loss protection (PLP) circuit, and a protection circuit, the method comprising:
  receiving, by the protection circuit, a PLP output voltage from the PLP circuit, wherein the PLP output voltage is provided with a stable voltage level during a power failure;
  receiving, by the protection circuit, a system supply voltage; and
  providing, by the protection circuit, a reset signal to a reset terminal of the controller in response to determining that the PLP output voltage of the PLP circuit is lower than a fraction of the system supply voltage, wherein the controller is coupled to the memory device, and the reset terminal of the controller is coupled to a capacitor, wherein the protection circuit is configured to pull the reset terminal to ground, by coupling an output of the protection circuit to ground when the PLP output voltage is lower than the fraction of the system supply voltage, to release energy stored in the capacitor due to a power failure.

17. The method according to claim 16, wherein the capacitor is coupled between the reset terminal of the controller and the ground.

18. The method according to claim 16, wherein the protection circuit comprises a comparator, a first input of the comparator is coupled to the PLP output voltage, a second input of the comparator is coupled to the fraction of the system supply voltage, and an output of the comparator is coupled to the reset terminal of the controller.

19. The method according to claim 18, wherein the comparator is an open drain comparator.

20. The method according to claim 18, wherein the second input of the comparator is coupled to the system supply voltage through a voltage divider comprising two or more resistors, the voltage divider is configured to generate the fraction of the system supply voltage that is lower than the PLP output voltage in response to at least that the system supply voltage is within a proper working range, the protection circuit is configured to hold the reset signal for a time period, and the time period is increased or decreased by adjusting at least one of the two or more resistors of the voltage divider.

* * * * *